US012622122B2

(12) United States Patent
Mezouari et al.

(10) Patent No.: US 12,622,122 B2
(45) Date of Patent: May 5, 2026

(54) PROCESS OF MAKING MONOLITHIC RGB MICRO LED DISPLAY USING DOWN CONVERTING MACROMOLECULES

(71) Applicant: Plessey Semiconductors Ltd, Plymouth Devon (GB)

(72) Inventors: Samir Mezouari, Plymouth Devon (GB); Geoff Dumas, Plymouth Devon (GB)

(73) Assignee: Plessey Semiconductors Ltd, Plymouth (GB)

( * ) Notice: Subject to any disclaimer, the term of this patent is extended or adjusted under 35 U.S.C. 154(b) by 426 days.

(21) Appl. No.: 18/030,841

(22) PCT Filed: Nov. 8, 2021

(86) PCT No.: PCT/GB2021/052887
§ 371 (c)(1),
(2) Date: Apr. 7, 2023

(87) PCT Pub. No.: WO2022/101611
PCT Pub. Date: May 19, 2022

(65) Prior Publication Data
US 2023/0369383 A1      Nov. 16, 2023

(30) Foreign Application Priority Data
Nov. 13, 2020      (GB) ...................................... 2017935

(51) Int. Cl.
*H10H 29/14*          (2025.01)
(52) U.S. Cl.
CPC .................................. *H10H 29/142* (2025.01)
(58) Field of Classification Search
CPC ............. H10H 29/142; H10H 29/8511; H10H 29/0361; H10H 29/10; H10H 20/8516;
(Continued)

(56) References Cited

U.S. PATENT DOCUMENTS

2006/0061260 A1 *    3/2006   Leo ........................ H10K 59/38
                                                                        313/506

FOREIGN PATENT DOCUMENTS

GB            2412662 A   * 10/2005   ............. H05B 33/12
JP       2014038702 A       8/2012
(Continued)

OTHER PUBLICATIONS

International Search Report and Written Opinion in PCT International Application No. PCT/GB2021/052887 mailed Apr. 5, 2022.
(Continued)

*Primary Examiner* — John P. Dulka
(74) *Attorney, Agent, or Firm* — Cognition IP, P.C.; Edward Steakley

(57)          ABSTRACT

A method of forming a multicolour light emitting array, the method comprising: providing a first light emitting device configured to emit light with a first primary peak wavelength and a second light emitting device configured to emit light with the first primary peak wavelength; forming a colour conversion region at least partially associated with the first light emitting device and the second light emitting device, wherein the colour conversion region is configured to absorb light with the first primary peak wavelength and emit light with a second primary peak wavelength longer than the first primary peak wavelength; and photo-bleaching a portion of the colour conversion region associated with the first light emitting device such that the colour conversion region associated with the first light emitting device is at least partially transparent to light with the first primary peak wavelength, thereby to enable light with the first primary peak wavelength to be emitted by a first pixel associated with the first light emitting device and light with the second primary peak wavelength to be emitted by a second pixel associated with the second light emitting device.

11 Claims, 3 Drawing Sheets

(58) Field of Classification Search
CPC ............. H10H 20/013; H10H 20/0361; H10H
20/8512; H10K 19/20; H10K 59/38
See application file for complete search history.

(56) References Cited

FOREIGN PATENT DOCUMENTS

| | | | |
|---|---|---|---|
| KR | 20200116006 A | 10/2020 | |
| TW | 200642131 A | 12/2006 | |
| WO | 2002011209 A2 | 2/2002 | |
| WO | WO-0211209 A2 * | 2/2002 | ............. H10K 59/38 |
| WO | WO-2013133139 A1 * | 9/2013 | ........... H10K 59/877 |

OTHER PUBLICATIONS

Combined Search and Examination Report under Sections 17 and 18(3) mailed on Apr. 22, 2021.
Patents Act 1977: Examination Report under Section 18(3) mailed on Oct. 24, 2022.
Patents Act 1977: Examination Report under Section 18(3) mailed on Feb. 15, 2023.
Wiles, Alan A., et al. "A poly (urethane)-encapsulated benzo [2, 3-d: 6, 7-d' ] diimidazole organic down-converter for green hybrid LEDs." Materials Chemistry Frontiers 4.3 (2020): 1006-1012.
Office Action received in counterpart Taiwanese application No. TW110142119, mailed on Sep. 30, 2025.

* cited by examiner

PROCESS OF MAKING MONOLITHIC RGB MICRO LED DISPLAY USING DOWN CONVERTING MACROMOLECULES

CROSS-REFERENCE TO RELATED APPLICATIONS

This application is a 35 U.S.C. § 371 U.S. National Stage application of International Application No. PCT/GB2021/052887, filed on Nov. 8, 2021, which claims the benefit of priority of Great Britain Application No. 2017935.4, filed on Nov. 13, 2020, which are incorporated herein by reference in their entirety.

FIELD OF THE INVENTION

The invention relates to an array of light emitting diodes (LEDs) and a method for forming an array of LEDs. In particular, but not exclusively, the invention relates to a multicolour monolithic array of light emitting diodes using down-converting organic semiconductors and a method for forming a multicolour monolithic array of light emitting diodes using down-converting organic semiconductors.

BACKGROUND OF THE INVENTION

It is known that light emitting diode (LED) devices provide efficient sources of light for a wide range of applications. Increases in LED light generation efficiency and extraction, along with the production of smaller LEDs (with smaller light emitting surface areas) and the integration of different wavelength LED emitters into arrays, has resulted in the provision of high quality colour arrays with multiple applications, in particular in display technologies.

In order to provide high resolution LED arrays, such as micro LED arrays, the light emitting surface area defining the pixel surface is reduced compared with the light emitting surface of conventional LEDs, as is the pixel pitch. However, as the pixel pitch in such arrays is reduced to very small pitches (e.g., less than 5 μm) in order to provide higher resolution arrays, a number of difficulties arise. For example, quantum dots (QDs) are typically used as colour conversion regions to achieve a full colour red green blue (RGB) display, where blue LEDs are typically used as the source of input light. Such QDs are typically used to convert blue input light to red light and green light using appropriate QDs. However, such QD layers are generally required to be of the order of 20 μm to 30 μm thick in order to achieve full colour saturation. Therefore, at these thicknesses, the minimum pixel that can be produced is restricted to a width of above 20 μm.

Further difficulties are known to arise in processing QDs for light wavelength colour conversion in micro LED arrays, such as degradation in efficiency and lifetime of the wavelength converting QDs when forming layers of material comprising QDs using photolithography and inkjet printing, for example. Accordingly, there are significant challenges in the pursuit of high resolution micro LED arrays, for which it would be beneficial to have a pixel pitch that is less than 10 μm.

SUMMARY OF THE INVENTION

In order to mitigate for at least some of the above described problems, there is provided a light emitting diode array comprising a plurality of light emitting pixels and a method of forming a light emitting diode array comprising a plurality of light emitting pixels in accordance with the appended claims.

There is provided a method of forming a multicolour light emitting array, the method comprising: providing a first light emitting device configured to emit light with a first primary peak wavelength and a second light emitting device configured to emit light with the first primary peak wavelength; forming a colour conversion region at least partially associated with the first light emitting device and the second light emitting device, wherein the colour conversion region is configured to absorb light with the first primary peak wavelength and emit light with a second primary peak wavelength longer than the first primary peak wavelength; and photo-bleaching a portion of the colour conversion region associated with the first light emitting device such that the colour conversion region associated with the first light emitting device is at least partially transparent to light with the first primary peak wavelength, thereby to enable light with the first primary peak wavelength to be emitted by a first pixel associated with the first light emitting device and light with the second primary peak wavelength to be emitted by a second pixel associated with the second light emitting device.

There is also provided a multicolour light emitting array comprising: a first pixel associated with a first light emitting device and a second pixel associated with a second light emitting device, wherein the first light emitting device is configured to emit light with a first primary peak wavelength and the second light emitting device is configured to emit light with the first primary peak wavelength; a colour conversion region at least partially associated with the first light emitting device and the second light emitting device, wherein the colour conversion region is configured to absorb light with the first primary peak wavelength and emit light with a second primary peak wavelength longer than the first primary peak wavelength, wherein a portion of the colour conversion region associated with the first light emitting device is photobleached such that the colour conversion region associated with the first light emitting device is at least partially transparent to light with the first primary peak wavelength, thereby to enable light with the first primary peak wavelength to be emitted by the first pixel and light with the second primary peak wavelength to be emitted by the second pixel.

Advantageously, the combination of forming and photo-bleaching a colour conversion region provides an efficient and effective way of colourising light output from light emitting devices that emit the same primary peak wavelength, such that the resultant array emits light with different wavelengths.

Preferably, the method comprises providing a third light emitting device, wherein the third light emitting device is configured to emit light with the first primary peak wavelength, wherein the colour conversion region is at least partially associated with the third light emitting device; photobleaching a portion of the colour conversion region associated with the third light emitting device such that the colour conversion region associated with the third light emitting device is at least partially transparent to light with the first primary peak wavelength; forming a further colour conversion region at least partially associated with the first light emitting device, the second light emitting device and the third light emitting device, wherein the further colour conversion region is at least partially transparent to light with the second primary peak wavelength, and configured to absorb light with the first primary peak wavelength and emit light with a third primary peak wavelength longer than the first primary peak wavelength; and photo-bleaching a portion of the further colour conversion region associated with the first light emitting device such that the further colour conversion region associated with the first light emitting device is transparent to light with the first primary peak wavelength, thereby to enable light with the first primary peak wavelength to be emitted by the first pixel, light with the second primary peak wavelength to be emitted by the second pixel and light with the third primary peak wavelength to be emitted by a third pixel associated with the third light emitting device. Advantageously, the process is used to provide light emitting at multiple different primary peak wavelengths. Beneficially, red-green-blue arrays can be produced, enabling full colour, high resolution, displays.

Preferably, photo-bleaching comprises irradiating the colour conversion region and/or the further colour conversion region with light having a wavelength of between 340 nm and 460 nm and an irradiance of greater than 5 W/cm$^2$ and preferably at least 10 W/cm$^2$, preferably wherein the temperature of the colour conversion region and/or the further colour conversion region is between 50° C. and 110° C. and more preferably wherein the temperature of the colour conversion region and/or the further colour conversion region is approximately 80° C. Advantageously, photobleaching under these conditions selectively prevents colour conversion of input light whilst allowing the input light to pass through the structure.

Preferably, the light emitting devices form part of a monolithic array, preferably wherein the monolithic array is a high resolution micro LED array. Preferably, the monolithic array comprises a plurality of epitaxial crystalline semiconductor layers, preferably wherein the epitaxial crystalline semiconductor layers comprise III-V compound semiconductor material. Beneficially, known techniques for providing high quality, efficient LED devices can be used and the wavelengths of the devices altered by the combination of colour conversion material and photobleaching.

Preferably, the colour conversion region and/or the further colour conversion region comprise organic semiconductors configured to absorb light with the first primary peak wavelength and re-emit light with a different primary peak wavelength. Advantageously, organic semiconductors provide efficient down conversion, enabling the use of thinner films and facilitating higher resolution arrays of light emitting pixels.

Preferably, the organic semiconductors are conjugated organic semiconductors, preferably wherein the conjugated organic semiconductors are dispersed in a photo definable material. Advantageously, such organic semiconductors can be deposited using spin/slit coating techniques and processed with known techniques that are compatible with LED array production.

Preferably, the colour conversion region is configured to emit light with a primary peak wavelength corresponding to red light. Preferably, the further colour conversion region is configured to emit light with a primary peak wavelength corresponding to green light. Advantageously, full colour displays are provided.

Preferably, the colour conversion region and/or the further colour conversion region, is a layer with a thickness less than or equal to 500 nm. Advantageously, thin layers facilitate smaller pixels for higher resolution displays.

Preferably the method comprises depositing organic semiconductors in a solvent, typically an organic solvent such as an alkene or alkane or mixtures thereof, preferably wherein the concentration of organic semiconductors in the solvent is 1 to 5%, more typically 2.5% by weight and more preferably wherein the solvent comprises toluene and heptane. Preferably, forming the colour conversion region and/or further colour conversion region comprises spin coating or slit coating. Advantageously, the colour conversion region is formed in an efficient manner and can be integrated into known processing steps.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which:

FIG. 6 shows a sequence for synthesis of a down converting organic semiconductor material.

Figures 1, 2, 3:
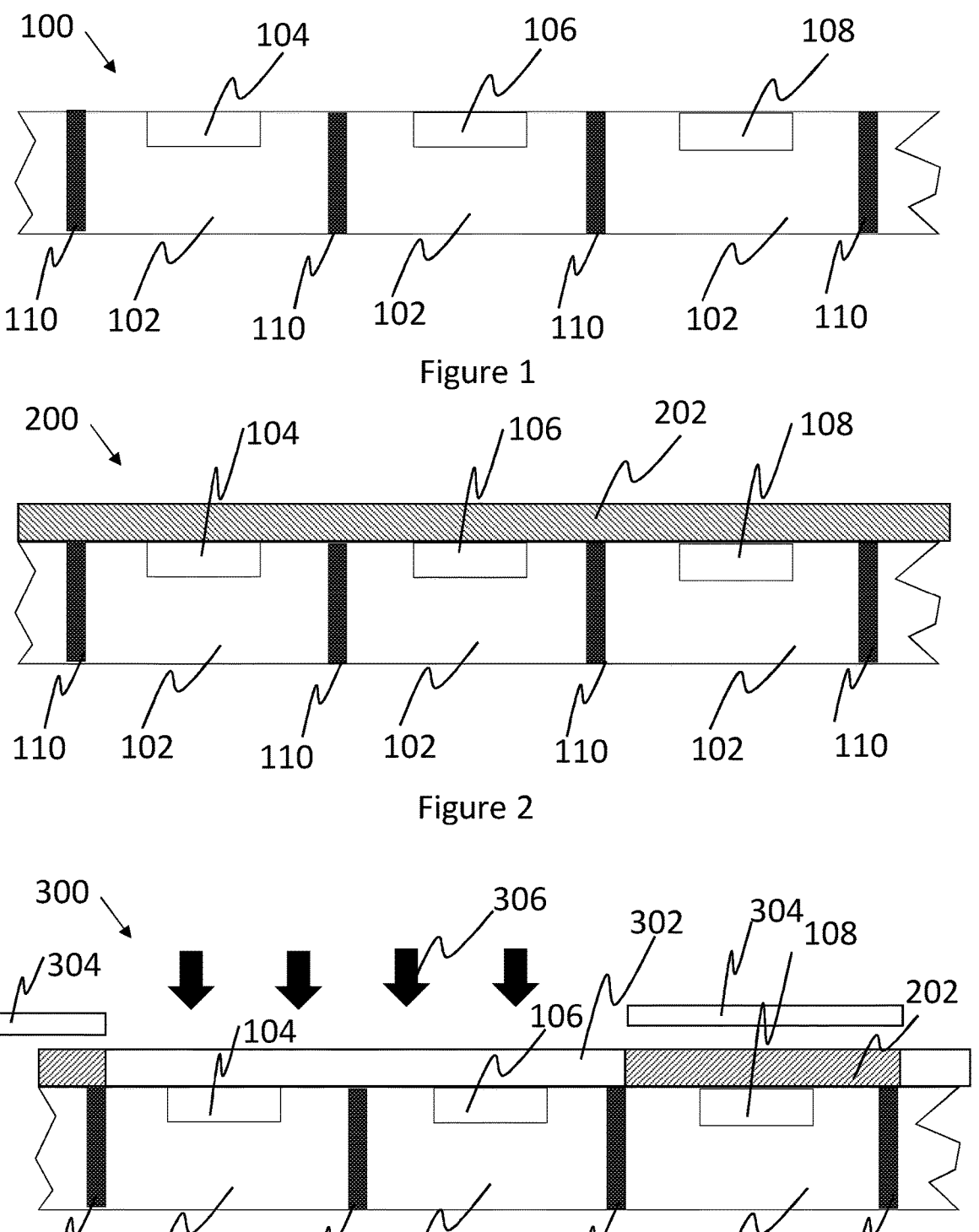
FIG. 1 shows a cross-sectional view of a portion of an array of light emitting devices.
FIG. 2 shows a cross-sectional view of the portion of an array of light emitting devices of FIG. 1 that has been processed.
FIG. 3 shows a cross-sectional view of photo bleaching of the processed portion of the array of light emitting devices of FIG. 2.

An elegant process for providing a multicolour light emitting array, such as a high resolution micro light emitting diode array, is described with reference to FIGS. 1 to 6. Advantageously, the process combines the application of coating colour conversion material to an array of light emitting devices with selective photobleaching of the colour conversion material to provide an efficient and commercially advantageous process for the colourisation of the array. Such a process, beneficially, enables the production of multicolour high resolution micro LED arrays, for example micro LED arrays with a pixel pitch of the order of 1 micron.

The colour conversion materials described herein are materials that can be used to down-convert light with one wavelength to provide light of a longer wavelength. For example, blue (approximately 450 nm) or UV light can be down-converted by absorption and emission by colour conversion material to provide light with green (approximately 540 nm) and/or red (approximately 630 nm) wavelengths. Advantageously, colour conversion material can be used to provide light emission at different wavelengths from an array of light emitting devices emitting at one wavelength (for example, a blue-light emitting array of LED devices), thereby taking advantage of known methods for producing high quality, efficient, light emitting arrays.

Colour conversion materials comprising a medium in which organic semiconductors are dispersed are known to enable the down-conversion of shorter (higher energy) wavelengths of light to provide light with longer (lower energy) wavelengths. It is known that down-converting organic semiconductors can be tuned in order to achieve targeted physical properties. In particular, advantageously, organic semiconductors can achieve specific values for the ionisation potential or electronic affinity, absorption and emission characteristics, charged transport properties, phase behaviour, solubility, and processability. Typically, organic semiconductors are conjugated organic semiconductors comprising a plurality of conjugated structures. In an example, such conjugated structures include a core and arm. The functionality of these constituent parts of the organic semiconductor are tuned in order to provide particular characteristics.

Macromolecules are discussed in *Acc. Chem. Res* 2019, 52, 1665 to 1674 and *J. Mater. Chem. C*, 2016, 4, 11499, for example, the contents of which are incorporated in their entirety. Macromolecules that are tunable include conjugated organic semiconductor comprising a plurality of conjugated structures. These are typically organic semiconductors. Such structures are formable to comprise a core and an arm. The plurality of conjugated structures can be formed to have a different functional properties, for example, different absorption and/or emission characteristics. Examples of conjugated structures include TPA-BDI (triphenylamine-benzodiimidazole) molecular species, which are benzodiimidazole-cored organic systems that can be prepared from commercially available starting materials. Benzodiimidazoles and their derivatives have tuneable optical properties by using push-pull donor-acceptor components.

The photochemical stability of materials such as organic semiconductors is an important factor in determining the suitability of the material for different applications. Such photochemical stability reflects the ability to undergo cycles of excitation and relaxation to a dark ground state without irreversible damage. Photobleaching, which occurs when there is irreversible loss of original optical properties, is discussed in '*Photobleaching of organic fluorophores: quantitative characterization, mechanisms, protection'*, *Methods and Applications in Fluorescence*, 2020, *Volume* 8, *Number* 2, for example, which is incorporated in its entirety. The photobleaching of organic semiconductors, such as conjugated polymer structures is generally considered to be undesirable as it deprives the organic semiconductors of the functionality for which they are ordinarily designed.

Advantageously, a process is described herein whereby the selective photobleaching of layers of down-converting macromolecules enables the colourisation of arrays of light emitting devices, such as monolithic nitride-based blue light emitting high resolution arrays.

FIG. 1 shows a cross-sectional view of a portion of an array 100 of light emitting devices, which is a monolithic light emitting diode (LED) array 100. There is shown a gallium nitride (GaN) based layer 102 upon which are formed three light emitting diode (LED) devices 104, 106, 108. A first LED device 104 is configured to emit light with a primary peak wavelength that corresponds to blue light. A second LED device 106 is configured to emit light with the primary peak wavelength that corresponds to blue light. A third LED device 108 is configured to emit light with the primary peak wavelength that corresponds to blue light. The three LED devices 104, 106, 108 are shown without electrical connections that facilitate the injection of carriers via p-type and n-type regions in order to provide emissive recombination and the skilled person understands that such electrical connections for injection of carriers by the p-type and n-type regions in a LED device may be implemented in different ways. For example, the monolithic LED array 100 can be coupled with a complementary metal oxide semiconductor (CMOS) backplane to control emission from individual LED devices.

Whilst the LED devices 104, 106, 108 are illustrated in a particular configuration in the array 100, the skilled person understands that alternative and/or additional configurations and implementations of LED devices may be used in combination with the further features described herein. Whilst only three LED devices 104, 106, 108 are shown in cross section, in further examples any appropriate number of LED devices is used to form an array 100.

The LED devices 104, 106, 108 are provided as part of a monolithic array 100 of light emitting devices. There is also shown a region 110 provided in between each of the LED devices 104, 106, 108 that is used to reduce optical crosstalk between the individual light emitting diode devices 104, 106, 108. By reducing optical cross talk between LED devices in an array, the distinction between colours of light emitted by pixels associated with each LED device is improved. The region 110 is a metallic region. Beneficially, the use of a reflective region, such as a metallic region means a reduction in light absorption in certain directions and re-use of light that is reflected when emitted in those certain directions (such as directions that do not lead to emission via a light emitting surface associated with a pixel). In further examples, alternative and/or additional materials are used to form the region 110. Whilst the region 110 is shown in FIG. 1 to pass through the GaN based region 102, any appropriate configuration of region 110 is used. Further layers, such as substrate layers and CMOS backplane layers are implemented in further examples, though not shown in FIG. 1.

The array of LED devices 104, 106, 108 is formed such that selectively addressable LED devices configured to emit light with a primary peak wavelength of light corresponding to blue light are provided. Whilst three LED devices 104, 106, 108 are shown, the skilled person understands in further examples, alternatively and/or additionally, different numbers of light emitting diode devices are provided.

The LED devices 104, 106, 108 are nitride-based, epitaxially grown, compound crystalline semiconductor LEDs 104, 106, 108. In further examples, other LEDs are used, such as other group III-V, or group II-VI based compound semiconductor materials. Advantageously, the LED devices 104, 106, 108 are grown monolithically, thereby to provide high quality material with excellent uniformity and efficiency, without a requirement to transfer individual LED devices. Beneficially, the monolithic LED array is coupled to a backplane (not shown) in order to enable control of individual LED devices 104, 106, 108 in the monolithic array. The LED devices 104, 106, 108 are grown as part of a monolithic array of LEDs using metal organic chemical vapour deposition (MOCVD). In further examples, alternative and/or additional techniques are used to form the LED devices 104, 106, 108 as part of a monolithic array, such as molecular beam epitaxy (MBE) and other suitable deposition/growth techniques. In further examples, other additional and/or alternative semiconductor fabrication and processing techniques are used to provide the monolithic array of LED devices 104, 108, 108. In further examples, alternatively and/or additionally, the array 100 is formed from individual LED devices that do not form part of a monolithic array.

Once an array 100 of LED devices 104, 106, 108 has been provided as described with respect to FIG. 1, the array 100 is processed as shown at FIG. 2.

FIG. 2 shows a cross sectional view of the portion of the array 100 of light emitting diode devices of FIG. 1 that has been processed to provide a processed array 200 that includes a colour conversion region 202. The colour conversion region 202 is a layer comprising organic semiconductor material configured to absorb light with a primary peak wavelength that corresponds to blue light and emit light with a primary peak wavelength that corresponds to red light. The colour conversion region 202 has a thickness of 500 nm. The colour conversion region 202 comprises organic semiconductors that convert blue light to red light with 2.5% weight concentration in a solvent. The solvent is made of 50% toluene and 50% heptane. In further examples the colour conversion region 202 has a different thickness and/or different composition. For example, the colour conversion region 202 has a thickness that substantially converts all of the input light from the LED device 108 to provide down-converted red light without the need to filter blue light in the resultant pixel associated with the LED device 108. In an example, the organic semiconductor material providing colour conversion functionality is a synthesised TPA-BDI (triphenylamine-benzodiimidazole) molecular species, which is a benzodiimidazole-cored organic system. Such materials can be prepared from commercially available starting materials. Benzodiimidazoles and their derivatives have tuneable optical properties by using push-pull donor-acceptor components. In an example, TPA-BDI in down-converting hybrid LED devices is incorporated into an optically transparent material, such as poly (urethane) resin as host and encapsulant.

Figure 6:
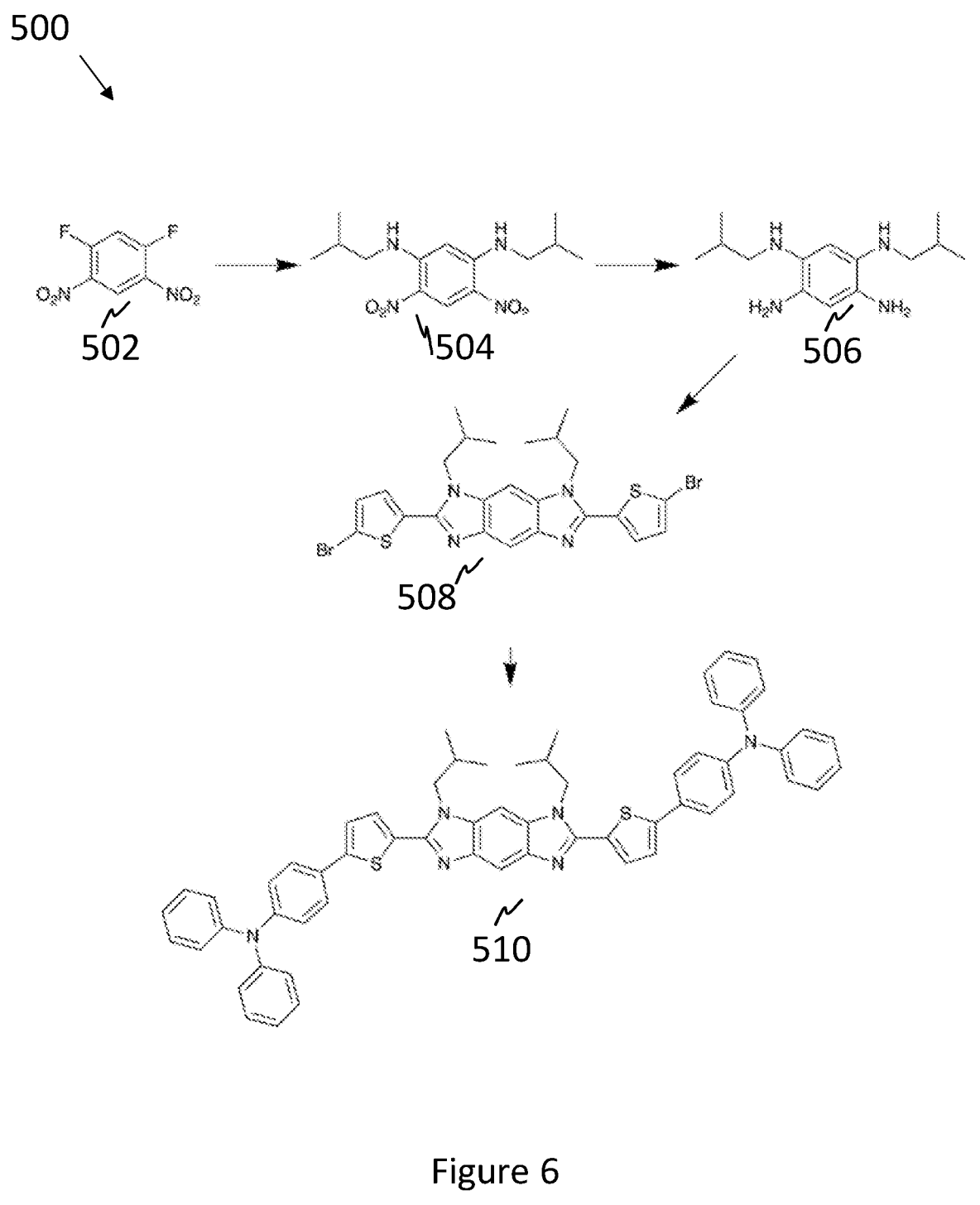

FIG. 6 shows how, in an example, TPA-BDI is synthesised in four steps from 1,5-difluoro-2,4-dinitrobenzene, shown as a first compound 502 in FIG. 6. There is shown an SNAr reaction of the first compound 502 with isobutylamine to provide a second compound 504 in high yield (for example, 90%). Subsequent reduction of the nitro groups of the second compound 504 provides a third compound 506 and condensation of the third compound with 5-bromo-2-thiophenecarboxaldehyde provides the key intermediate fourth compound 508 in approximately 47% yield over two steps. The final material TPA-BDI 510 is obtained through Suzuki-Miyaura cross-coupling of the fourth compound 508 with 4-(diphenylamino)phenylboronic acid pinacol ester in moderate yield (for example, 55%), thereby to provide TPA-BDI 510. Whilst the organic semiconductor material is Benzodiimidazoles and their derivatives in an example, in further examples, alternative and/or additional organic semiconductor materials providing light conversion functionality is used in the colour conversion region 202.

In a further example, the organic semiconductor macromolecule is based on 4,4-difluoro-4-bora-3a,4a-diaza-s-indacene (BODIPY), for example the macromolecule comprises a BODIPY core. In yet further examples, the macromolecule is based on an electron-deficient 2,1,3-benzothiadiazole (BT) core, or the corresponding dimer, in tandem with fluorine and/or triphenyl-amine donor arms. For example, the macromolecule comprises (TPA-Flu)$_2$BT and (TPA-Flu)$_2$BTBT.

Advantageously, conjugated macromolecules formed from organic semiconductors can achieve full colour saturation within very thin films, typically in the order of sub-micron, without the requirement of an additional blue blocking filter that would otherwise be used if a significant amount of blue input light is not converted/absorbed by the colour conversion material. In contrast, to organic semiconductor material, such as conjugated macromolecules, quantum dot films use thicknesses in excess of 20 μm to achieve similar colour saturation performance. Beneficially, full colour saturation within a thin film allows the macromolecules to define pixels at a smaller pitch than traditional quantum dot films. Further, advantageously, the use of a thin colour conversion region will lead to significantly higher efficiencies over conventional quantum dots, due to less re-absorption.

The ability to tune the macromolecule allows its full dissolution within photo definable material, allowing stan-dard semiconductor processing techniques to be utilized. The utilization of existing techniques enables economic volume processing. In contrast, quantum dots tend to suffer from increased degradation in a photo definable medium.

Once the colour conversion region 202 has been provided as described at FIG. 2, the process moves to that described with respect to FIG. 3. FIG. 3 shows a cross-sectional view of the photobleaching of the processed array 200 to provide a partially photobleached array 300. In order to photobleach the processed array 200, a mask 304 is used selectively to cover a portion of the array 200 of light emitting devices. As demonstrated with reference to FIG. 3, the mask 304 is used to cover the third light emitting diode device 108 and the portion of the colour conversion region 202 above it. The first light emitting device 104 and the second light emitting diode device 106 are not covered by the mask 204. The mask 304 is a hard mask formed using known techniques. In further examples, the mask 304 is patterned on the surface of the colour conversion region 202 using known lithographical techniques and subsequently removed once the colour conversion region 202 has been illuminated as described below.

The light emitting diode devices 104, 106, 108 each have a portion of colour conversion region 202 that is associated with them. The mask 304 is illuminated with radiation 306 such that the colour conversion region 202 associated with the first light emitting diode device 104 and the second light emitting diode device 106 is subject to the radiation 306 and the colour conversion region 202 associated with the third light emitting diode device 108 is not subject to the radiation. Accordingly, illumination of the selectively masked array results in the exposed portion 302 of the colour conversion region 202 being subject to the radiation 306 and the masked portion of the colour conversion region 202 being shielded from the radiation 306 by the mask 304.

The conditions under which the array of light emitting devices is subject to radiation 306 results in changes in the portion 302 of the colour conversion of region 202 associated with the first and second light emitting diode devices 104, 106. The portion 302 of colour conversion region 202 associated with the first and second light emitting diode devices 104, 106 is irradiated to provide a photobleached portion 302 of the colour conversion region 202. In order to photobleach a portion 302 of the colour conversion region 202, radiation 306 with a wavelength substantially between 340 nm and 460 nm is used. The intensity of the radiation 306 is equal to, or greater than to 10 W/cm$^2$. The photo bleaching process is performed at a temperature of approximately 80° C. In further examples, different conditions are used in order to alter, irreversibly, the optical properties of the colour conversion region 202 such that only masked portions provide down-conversion of input light whilst the photobleached portion 302 allows input light from the LEDs with which it is associated to be transmitted through it.

Once photobleached, the photobleached portion 302, whilst formed to include the same organic semiconductor material as the non-photobleached portion of the colour conversion region 202, no longer absorbs light with a first primary peak wave corresponding to blue light, emitting the absorbed and subsequently down-converted blue light with a primary peak wave corresponding to red light. Rather, the photo bleached portion 302 of the colour conversion region 202 is transparent to light with the first primary peak wavelength corresponding to blue light emitted from light emitting diode devices 104, 106. The colour conversion region 202 associated with the third light emitting diode device 108 continues to function by absorbing blue light and emitting red light. Once the colour conversion region 202 has been processed to provide a photo bleached portion 302 and a non-photobleached portion associated with the third light emitting diode device 108, the process moves to that described with respect to FIG. 4.

It is noted that whilst FIG. 3 shows photobleaching of the colour conversion region associated with two of three LED devices, in further examples, any number of LED devices in an array are covered using a mask, such as the mask 304 of FIG. 3, to enable selective photobleaching of the colour conversion region 202 such that the photobleached areas of the colour conversion region 202 are irreversibly altered and do not absorb and down-convert light from the associated LED devices.

Figure 4:
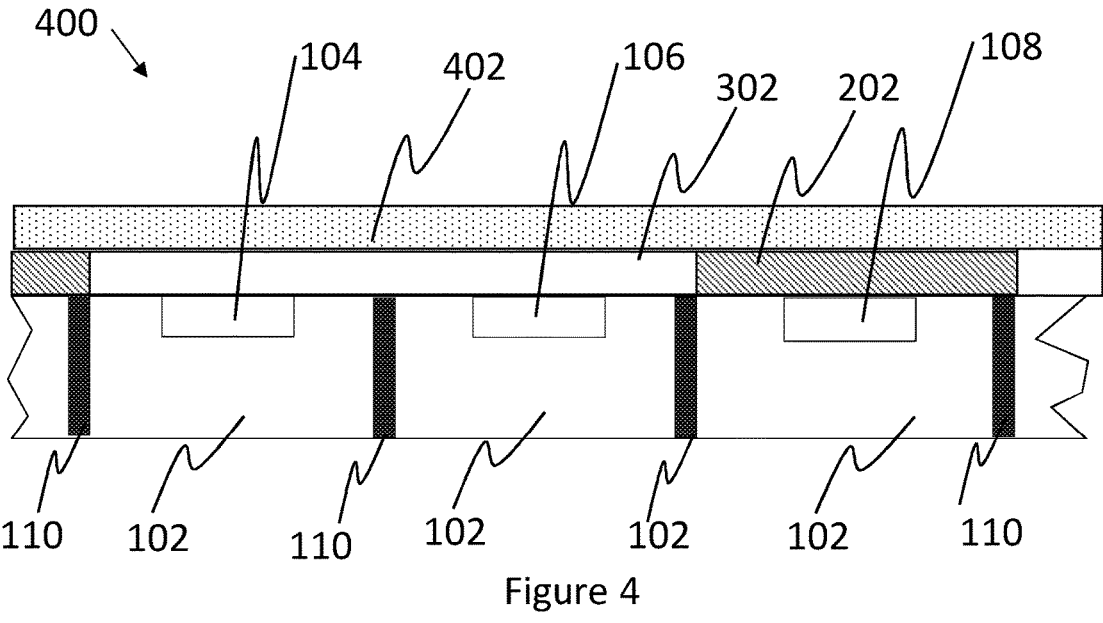
FIG. 4 shows a cross-sectional view of the portion of an array of light emitting devices of FIG. 3 that has been processed.

FIG. 4 shows a cross-sectional view of the array 300 of FIG. 300 that has been processed further in order to provide a processed array 400 with a further colour conversion region 402. The further colour conversion region 402 has a thickness of 500 nm. In further examples, the further colour conversion region 402, alternatively and/or additionally has a different thickness. The further colour conversion region 402 is configured to absorb light with a primary peak wavelength corresponding to blue light, as emitted by the light emitting diode devices 104, 106, 108 of the light emitting diode device array and emits light with a primary peak wavelength corresponding to green light. The further colour conversion region 402 has a concentration by weight of organic semiconductors in solvent of 2.5% organic semiconductors. The solvent is made of 50% toluene and 50% heptane. In further examples the colour conversion region 202 has a different thickness and/or different composition. The further colour conversion region 402 is provided by slit coating or spin coating. In further examples, alternative and/or additional techniques are used to deposit/form the further colour conversion region 402 in the processed array 400. In an example, the organic semiconductor material providing colour conversion functionality is a synthesised TPA-BDI molecular species, which is a benzodiimidazole-cored organic system. Such materials can be prepared from commercially available starting materials. Benzodiimidazoles and their derivatives have tuneable optical properties by using push-pull donor-acceptor components. In an example, TPA-BDI in down-converting hybrid LED devices is incorporated into an optically transparent poly(urethane) resin as host and encapsulant. Whilst transparent poly(ure-thane) resin is used as host and encapsulant, in further examples, the organic semiconductor material is dispersed in a different medium.

FIG. 6 shows how, in an example, TPA-BDI is synthesised in four steps from 1,5-difluoro-2,4-dinitrobenzene, shown as a first compound 502 in FIG. 6. There is shown an SNAr reaction of the first compound 502 with isobutylamine to provide a second compound 504 in high yield (for example, 90%). Subsequent reduction of the nitro groups of the second compound 504 provides a third compound 506 and condensation of the third compound with 5-bromo-2-thiophenecarboxaldehyde provides the key intermediate fourth compound 508 in approximately 47% yield over two steps. The final material TPA-BDI 510 is obtained through Suzuki-Miyaura cross-coupling of the fourth compound 508 with 4-(diphenylamino)phenylboronic acid pinacol ester in moderate yield (for example, 55%), thereby to provide TPA-BDI 510. Whilst the organic semiconductor material is Benzodiimidazoles and their derivatives in an example, in further examples, alternative and/or additional organic semi-conductor materials providing light conversion functionality is used in the colour conversion region 402.

In a further example, the organic semiconductor macro-molecule is based on 4,4-difluoro-4-bora-3a,4a-diaza-s-in-dacene (BODIPY), for example the macromolecule comprises a BODIPY core. In yet further examples, the macromolecule is based on an electron-deficient 2,1,3-ben-zothiadiazole (BT) core, or the corresponding dimer, in tandem with fluorine and/or triphenyl-amine donor arms. For example, the macromolecule comprises $(TPA-Flu)_2BT$ and $(TPA-Flu)_2BTBT$.

Figure 5:
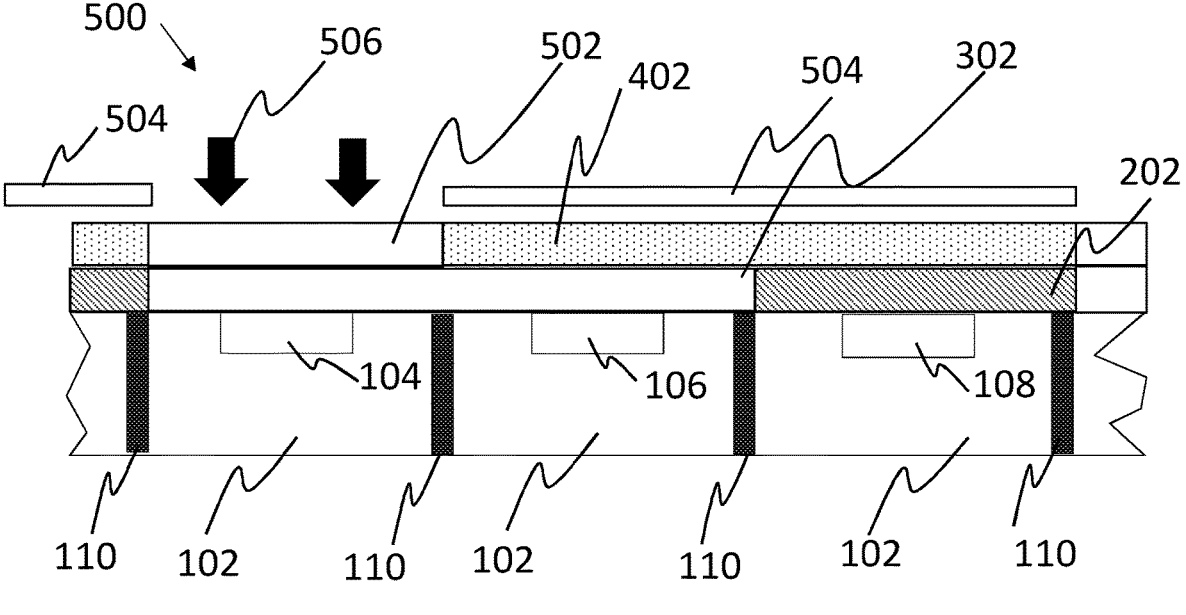
FIG. 5 shows a cross-sectional view of photo bleaching of the processed portion of the array of light emitting devices of FIG. 4.

Once the further colour conversion region 402 has been provided, the process moves to that described with respect to FIG. 5. FIG. 5 shows a cross-sectional view of a photo-bleached array 500 of light emitting devices that is provided by photobleaching the processed array 400 described with reference to FIG. 4. There is shown a mask 504 that is selectively used to cover the further colour conversion region 402 associated with the second light emitting diode device 106 and the third light emitting device 108. The mask 504 is a hard mask formed using known techniques. In further examples, the mask 504 is patterned on the surface of the colour conversion region 402 using known litho-graphical techniques and subsequently removed once the colour conversion region 402 has been illuminated as described below. The mask 504 is then subject to radiation 506 under suitable conditions. In order to photo bleach a portion 502 of the further colour conversion region 402, radiation 506 with a wavelength substantially between 340 nm and 460 nm is used. The intensity of the radiation 306 is greater than or equal to 10 $W/cm^2$. The photo bleaching process is performed at a temperature of approximately 80° C. In further examples, different conditions are used in order irreversibly to alter the optical properties of the further colour conversion region 402 such that only masked por-tions provide down-conversion of input light.

Accordingly, the portion 502 of further colour conversion region 402 associated with the first light emitting diode device 104 is photobleached and the further colour conver-sion region 402 associated with the second and third light emitting diode devices 106, 108 is not photobleached.

The resultant structure is such that light emitted from the first light emitting device 104 passes through both the photobleached portion 302 of the colour conversion region 202 and the photobleached portion 502 of the further colour conversion region 402 where it has been photobleached to provide photobleached colour conversion region portion 302 and a photobleached further colour conversion region por-tion 502 associated with the further colour conversion region 402. Light emitted from the second light emitting diode device 106 passes through the photobleached portion 302 of the colour conversion region 202 and is absorbed in the further colour conversion region 402 where it is down converted and subsequently emitted as light with a primary peak wave corresponding to green light. Light emitted from the third LED device 108 is absorbed in the colour conver-sion region 202 where it is down converted to provide red light. The red light then passes through the further colour conversion region 402 where it is emitted from the structure 500 as red light. The red light, which has a longer wave-length than green light, is not absorbed by the further colour conversion region 402 and is instead transmitted through the further colour conversion region 402.

The result of selectively photobleaching portions of the colour conversion regions 202, 402 is that there is a light emitting surface associated with each of the LEDs 104, 106, 108 that emits light with a different primary peak wave-length. The light emitting surface associated with the first LED device 104 provides a first pixel that emits blue light, the light emitting surface associated with the second LED device 106 provides a second pixel that emits green light and the light emitting surface associated with the third LED device 108 provides a third pixel that emits red light. Whilst there is shown a difference in cross sectional width the LED devices 104, 106, 108 and the cross sectional width of the photobleached and non-photobleached portions of the colour conversion regions 202, 402, in further examples the configuration of such features is adapted to provide appropriate shapes, sizes and pitches of pixels in arrays of pixels.

Accordingly, a blue light emitting monolithic array of light emitting devices is used to provide light of blue, green and red wavelengths. Whilst colour conversion is shown for three light emitting diode devices, the skilled person understands that the process is applicable to arrays of any number of such devices, as well as to other wavelengths of light.

The process is a simple and elegant way of colourising a blue light emitting diode device array. Advantageously, organic semiconductors dispersed in a medium, such as conjugated polymer macromolecules, can achieve full colour saturation within very thin films, typically in the order of sub-micron without the requirement of an additional blue blocking filter. Furthermore, full colour saturation within a thin film allows the macromolecule to define pixels at a smaller pitch than traditional quantum dot films. Generally, quantum dot films require thickness in excess of 20 μm to achieve similar colour saturation performance.

A further benefit of thin films is that the use of a thin colour conversion layer will lead to significantly higher efficiencies over conventional quantum dots due to less re-absorption.

Beneficially, the ability to tune the macromolecule allows its full dissolution within photo definable material allowing standard semiconductor processing techniques to be utilized. The utilization of existing techniques enables economic volume processing. In contrast, quantum dots tend to suffer from increased degradation in a photo definable medium.

What is claimed is:

1. A method of forming a multicolor light emitting array, the method comprising:

providing a first light emitting device configured to emit light with a first primary peak wavelength and a second light emitting device configured to emit light with the first primary peak wavelength and a third light emitting device configured to emit light with the first primary peak wavelength;

forming a color conversion region on the first second and third light emitting devices, wherein the color conversion region is configured to absorb light with the first primary peak wavelength and emit light with a second primary peak wavelength longer than the first primary peak wavelength;

masking a portion of the color conversion region on the third light emitting device, and photo-bleaching a portion of the color conversion region on the first light emitting device and the second light emitting device such that the color conversion region on the first light emitting device and the second light emitting device is at least partially transparent to light with the first primary peak wavelength;

subsequently forming a further color conversion region on the color conversion region, wherein the further color conversion region is at least partially transparent to light with the second primary peak wavelength, and configured to absorb light with the first primary peak wavelength and emit light with a third primary peak wavelength longer than the first primary peak wavelength and shorter than the second primary peak wavelength;

masking a portion of the further color conversion region on the portion of the color conversion region on the second light emitting device and the third light emitting device and photo-bleaching a portion of the further color conversion region on the portion of the color conversion region on the first light emitting device such that the further color conversion region on the portion of the color conversion region on the first light emitting device is transparent to light with the first primary peak wavelength, thereby to enable light with the first primary peak wavelength to be emitted by a first pixel associated with the first light emitting device, light with the third primary peak wavelength to be emitted by a second pixel associated with the second light emitting device and light with the second primary peak wavelength to be emitted by a third pixel associated with the third light emitting device.

2. The method of forming a multicolor light emitting array according to claim 1, wherein photo-bleaching comprises irradiating the color conversion region and/or the further color conversion region, with light having a wavelength of between 340 nm and 460 nm and an irradiance of at least 10 W/cm$^2$, and the temperature of the color conversion region and/or the further color conversion region is between 50° C. and 110° C.

3. The method of forming a multicolor light emitting array according to claim 1, wherein the light emitting devices form part of a high resolution monolithic array.

4. The method of forming a multicolor light emitting array according claim 3, wherein the monolithic array comprises a plurality of epitaxial crystalline semiconductor layers.

5. The method of forming a multicolor light emitting array according to claim 1, wherein the color conversion region and/or the further color conversion region comprises organic semiconductors configured to absorb light with the first primary peak wavelength and re-emit light with a different primary peak wavelength.

6. The method of forming a multicolor light emitting array according to claim 5, wherein the organic semiconductors are conjugated organic semiconductors.

7. The method of forming a multicolor light emitting array according to claim 1, wherein the color conversion region is configured to emit light with a primary peak wavelength corresponding to red light.

8. The method of forming a multicolor light emitting array according to claim 1, wherein the further color conversion region is configured to emit light with a primary peak wavelength corresponding to green light.

9. The method of forming a multicolor light emitting array according to claim 1, wherein the color conversion region and/or the further color conversion region is a layer with a thickness less than or equal to 500 nm.

10. The method of forming a multicolor light emitting array according to claim 1, wherein forming the color conversion region and/or the further color conversion region comprises depositing organic semiconductors in a solvent, wherein the concentration of organic semiconductors in the solve is 2.5% by weight.

11. The method of forming a multicolor light emitting array according to claim 1, wherein forming the color conversion region and/or the further color conversion region comprises one of a spin coating and a slit coating.

\* \* \* \* \*